US009236861B2

(12) United States Patent
Soo et al.

(10) Patent No.: US 9,236,861 B2
(45) Date of Patent: *Jan. 12, 2016

(54) CAPACITIVE PROXIMITY SENSOR WITH ENABLED TOUCH DETECTION

(75) Inventors: Jenn Woei Soo, Singapore (SG); Kien Beng Tan, Singapore (SG)

(73) Assignee: STMicroelectronics Asia Pacific Pte Ltd, Singapore (SG)

(*) Notice: Subject to any disclaimer, the term of this patent is extended or adjusted under 35 U.S.C. 154(b) by 528 days.

This patent is subject to a terminal disclaimer.

(21) Appl. No.: 13/539,704

(22) Filed: Jul. 2, 2012

(65) Prior Publication Data

US 2014/0002108 A1    Jan. 2, 2014

(51) Int. Cl.
    *G01R 27/32*      (2006.01)
    *H03K 17/96*      (2006.01)

(52) U.S. Cl.
    CPC .. *H03K 17/9622* (2013.01); *H03K 2217/96074* (2013.01); *H03K 2217/960765* (2013.01)

(58) Field of Classification Search
    CPC ........................................................ G01R 27/32
    USPC ........................................ 324/650–690, 647
    See application file for complete search history.

(56) References Cited

U.S. PATENT DOCUMENTS

| 4,563,645 | A | 1/1986 | Kerr |
| 5,359,156 | A | 10/1994 | Chan et al. |
| 5,854,625 | A | 12/1998 | Frisch et al. |
| 5,977,803 | A | 11/1999 | Tsugai |
| 6,002,387 | A | 12/1999 | Ronkka et al. |
| 6,075,520 | A | 6/2000 | Inoue et al. |
| 6,545,612 | B1 | 4/2003 | Lindgren et al. |
| 7,030,860 | B1 | 4/2006 | Hsu et al. |
| 7,454,967 | B2 | 11/2008 | Skurnik |
| 7,812,825 | B2 | 10/2010 | Sinclair et al. |
| 8,294,678 | B2 | 10/2012 | Wu |
| 8,300,024 | B2 | 10/2012 | Wu |
| 8,481,872 | B2 | 7/2013 | Zachut |
| 8,618,819 | B2 | 12/2013 | Sawataishi et al. |
| 2003/0080755 | A1* | 5/2003 | Kobayashi ................ 324/658 |
| 2003/0142081 | A1 | 7/2003 | Iizuka et al. |
| 2005/0030724 | A1 | 2/2005 | Ryhanen et al. |
| 2005/0094022 | A1 | 5/2005 | Wang et al. |
| 2006/0125801 | A1 | 6/2006 | Hsu et al. |
| 2007/0070050 | A1* | 3/2007 | Westerman et al. .......... 345/173 |

(Continued)

OTHER PUBLICATIONS

Lei, et al., "An Oversampled Capacitance-to-Voltage Converter IC With Application to Time-Domain Characterization of MEMS Resonators", IEEE Sensors Journal, vol. 5, No. 6, Dec. 2005, pp. 1353-1361.

(Continued)

*Primary Examiner* — Arleen M Vazquez
*Assistant Examiner* — Brent J Andrews
(74) *Attorney, Agent, or Firm* — Gardere Wynne Sewell LLP

(57) ABSTRACT

A capacitive proximity sensor circuit capable of distinguishing between instances of detected user proximity includes one or more guard electrodes, a first sensor, and a second sensor. The capacitive proximity sensor is installed in a device such that a first sensor faces a first component of the device, and the second sensor faces a second component of the device. The first and second sensors measure a capacitance to detect proximity of a user relative to the respective sensor. The guard electrode is provided to mitigate stray capacitance to reduce error in the capacitance measurements obtained by the first and second sensors.

24 Claims, 5 Drawing Sheets

(56) References Cited

U.S. PATENT DOCUMENTS

| | | |
|---|---|---|
| 2007/0089527 A1 | 4/2007 | Shank et al. |
| 2007/0159184 A1 | 7/2007 | Reynolds et al. |
| 2007/0195009 A1 | 8/2007 | Yamamoto et al. |
| 2007/0229470 A1 | 10/2007 | Snyder et al. |
| 2007/0268266 A1 | 11/2007 | XiaoPing |
| 2007/0273660 A1 | 11/2007 | XiaoPing |
| 2008/0007534 A1 | 1/2008 | Peng et al. |
| 2009/0174679 A1* | 7/2009 | Westerman ............... 345/173 |
| 2009/0231294 A1 | 9/2009 | Wu |
| 2009/0244014 A1 | 10/2009 | Hotelling et al. |
| 2009/0296742 A1 | 12/2009 | Sicurello et al. |
| 2009/0303198 A1 | 12/2009 | Yilmaz et al. |
| 2009/0322355 A1 | 12/2009 | Day et al. |
| 2009/0322410 A1 | 12/2009 | David et al. |
| 2010/0097077 A1 | 4/2010 | Philipp et al. |
| 2010/0097078 A1 | 4/2010 | Philipp et al. |
| 2010/0149125 A1 | 6/2010 | Klinghult et al. |
| 2010/0149126 A1 | 6/2010 | Futter |
| 2010/0188105 A1 | 7/2010 | Khanna et al. |
| 2010/0289503 A1 | 11/2010 | Reynolds et al. |
| 2010/0292945 A1 | 11/2010 | Reynolds et al. |
| 2010/0315099 A1 | 12/2010 | Ootaka |
| 2011/0074446 A1 | 3/2011 | Chou et al. |
| 2011/0096024 A1 | 4/2011 | Kwak |
| 2011/0115503 A1 | 5/2011 | Chou et al. |
| 2011/0133756 A1* | 6/2011 | Reime ............... 324/658 |
| 2011/0187666 A1 | 8/2011 | Min |
| 2011/0216094 A1 | 9/2011 | Murakami |
| 2011/0234528 A1 | 9/2011 | Guedon et al. |
| 2011/0242048 A1 | 10/2011 | Guedon et al. |
| 2011/0273400 A1 | 11/2011 | Kwon et al. |
| 2012/0044210 A1 | 2/2012 | Chen et al. |
| 2012/0146668 A1 | 6/2012 | Satake et al. |
| 2012/0200388 A1 | 8/2012 | Miura et al. |
| 2012/0229421 A1 | 9/2012 | Kim et al. |
| 2012/0256645 A1 | 10/2012 | Nguyen et al. |
| 2012/0327041 A1 | 12/2012 | Harley et al. |
| 2012/0331546 A1 | 12/2012 | Falkenburg et al. |
| 2013/0106725 A1 | 5/2013 | Bakken et al. |
| 2013/0154956 A1 | 6/2013 | Tudosoiu |
| 2014/0002108 A1 | 1/2014 | Soo et al. |
| 2014/0015595 A1 | 1/2014 | Van Ausdall et al. |
| 2014/0062922 A1 | 3/2014 | Tang |
| 2014/0267186 A1 | 9/2014 | Kreek et al. |

OTHER PUBLICATIONS

U.S. Appl. No. 12/972,159 entitled "Capacitive Sensing Analog Front End", by Yannick Guedon et al, filed Mar. 31, 2010, 51 pgs.

U.S. Appl. No. 12/732,581 entitled "Sample and Hold Capacitance to Digital Converter" by Yannick Guedon, filed Mar. 26, 2010, 20 pgs.

U.S. Appl. No. 12/829,130 entitled "Sensing Phase Sequence to Suppress Single Tone Noise" by Inventor Kusuma Adi Ningrat, filed Jul. 1, 2010, 27 pgs.

* cited by examiner

CAPACITIVE PROXIMITY SENSOR WITH ENABLED TOUCH DETECTION

FIELD OF THE INVENTION

This invention generally relates to proximity-sensing circuitry and, more particularly, to proximity-sensing circuitry implementing a capacitive sensor.

BACKGROUND

In various technological applications, it is oftentimes advantageous to sense the proximity of an object relative to a device. For example, in mobile phone applications, it may be advantageous to detect the proximity of a user's head to the phone's display, such as when the user is participating in a phone call, so that the display panel may be disabled and battery consumption thereby reduced.

One such solution for sensing the proximity of objects involves the use of an optical sensor. However, optical sensors tend to be cost-prohibitive and may be difficult to incorporate in various devices. Another solution for sensing proximity of an object involves the use of a capacitive sensor. However, conventional capacitive proximity-sensing technology is unsophisticated as it is unable to distinguish between an object held above the sensor (e.g., a user's head) and an object in contact with components of the device. For example, in mobile phone applications, a user touching the casing of the mobile phone, even at a distance from the sensor, causes the conventional capacitive proximity-sensing circuitry to incorrectly register proximity detection of an object. As such, conventional capacitive proximity-sensing technology has not been satisfactory for all conditions of use.

SUMMARY

The present disclosure provides a capacitive proximity sensing circuit comprising: one or more guard electrodes; first capacitive sensor circuitry operable to sense a first capacitance and produce a first capacitive sensor reading indicative of the sensed first capacitance, wherein the first capacitive sensor circuitry includes a first capacitive sensor coupled to a first side of at least one of the one or more guard electrodes; and second capacitive sensor circuitry operable to sense a second capacitance and produce a second capacitive sensor reading indicative of the sensed second capacitance, wherein the second capacitive sensor circuitry includes a second capacitive sensor coupled to a second side of at least one of the one or more guard electrodes.

Another embodiment provides a capacitive proximity sensing circuit comprising: one or more guard electrodes; a first sensor coupled to a first side of at least one of the one or more guard electrodes; a second sensor coupled to a second side of at least one of the one or more guard electrodes; first capacitive sensor circuitry coupled to the first sensor, the first capacitive sensor circuitry operable to sense user proximity with respect to the first sensor and to produce a first capacitive sensor reading indicative of the sensed user proximity with respect to the first sensor; and second capacitive sensor circuitry coupled to the second sensor, the second capacitive sensor circuitry operable to sense user proximity with respect to the second sensor and to produce a second capacitive sensor reading indicative of the sensed user proximity with respect to the second sensor.

Yet another embodiment provides an integrated circuit operable to detect user proximity with respect to a first component of a device and user proximity with respect to a second component of the device, the integrated circuit comprising: a first switched capacitive integrator circuit coupled towards the first component of the device, the first switched capacitive integrator circuit operable to sense a first capacitance and produce a first output signal in response to the sensed first capacitance; a second switched capacitive integrator circuit coupled towards the second component of the device, the second switched capacitive integrator circuit operable to sense a second capacitance and produce a second output signal in response to the sensed second capacitance; one or more capacitive plates, wherein at least one of the one or more capacitive plates is coupled on a first side to the first switched capacitive integrator circuit, and at least one of the one or more capacitive plates is coupled on a second side to the second switched capacitive integrator circuit; and output circuitry operable to receive the first output signal and second output signal, and to produce a third output signal operable to indicate detection of the user proximity with respect to one of the first switched capacitive integrator circuit or the second switched capacitive integrator circuit.

The foregoing and other features and advantages of the present disclosure will become further apparent from the following detailed description of the embodiments, read in conjunction with the accompanying drawings. The detailed description and drawings are merely illustrative of the disclosure, rather than limiting the scope of the invention as defined by the appended claims and equivalents thereof.

BRIEF DESCRIPTION OF DRAWINGS

Embodiments are illustrated by way of example in the accompanying figures not necessarily drawn to scale, in which like numbers indicate similar parts, and in which.

DETAILED DESCRIPTION OF THE EMBODIMENTS

This application incorporates by reference for all purposes U.S. patent application Ser. No. 13/539,731, entitled "Directional Capacitive Proximity Sensor with Bootstrapping," filed Jul. 2, 2012.

The present disclosure provides a capacitive proximity sensor circuit capable of distinguishing between instances of detected user proximity. The capacitive proximity sensor disclosed herein is generally described in various embodiments in which the capacitive proximity sensor is installed in a mobile phone device, wherein advantages of the proximity sensing may include distinguishing user proximity detected above the plane of the sensor (e.g., the user touching a section of the phone's display screen located above the sensor) from user proximity detected at a remote location on the phone (e.g., the user touching the external casing of the phone). It should be appreciated that the capacitive proximity sensor disclosed herein may be applied to other devices such as, for example, GPS devices, tablet computers, mobile media players, remote controls, and various other devices, and may provide proximity sensing for reasons other than those discussed herein.

Figure 1A:
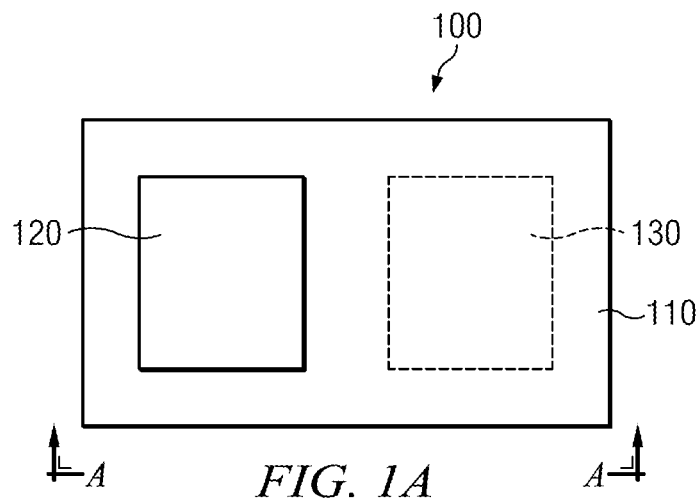
FIGS. 1A and 1B illustrate an example embodiment of capacitive proximity sensor circuitry.
Figure 1B:
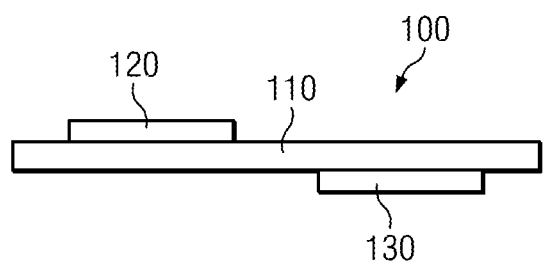

FIGS. 1A and 1B illustrate an example embodiment of the disclosed capacitive proximity sensor 100, wherein the sensor 100 is shown in FIG. 1A from a front view and in FIG. 1B from a side view along line A-A of FIG. 1A. The sensor 100, includes a guard electrode 110, a first sensor 120 disposed on a first side of the guard electrode 110, and a second sensor 130 disposed on a second (opposite) side of the guard electrode 110. In general, the first and second sensors 120 and 130 are each designed to measure a capacitance to detect proximity of a user relative to the respective sensor. The guard electrode 110 is provided to mitigate stray capacitance to reduce error in the capacitance measurements obtained by the first and second sensors 120 and 130. In some embodiments, this may be achieved by a "bootstrapping" technique wherein the guard electrode 110 is controlled with a low impedance output applied to a known voltage (or known voltage waveform), thereby shielding the first and second sensors 120 and 130 from interfering signals and reducing effect of the guard electrode 110 on the sensors.

Figure 2A:
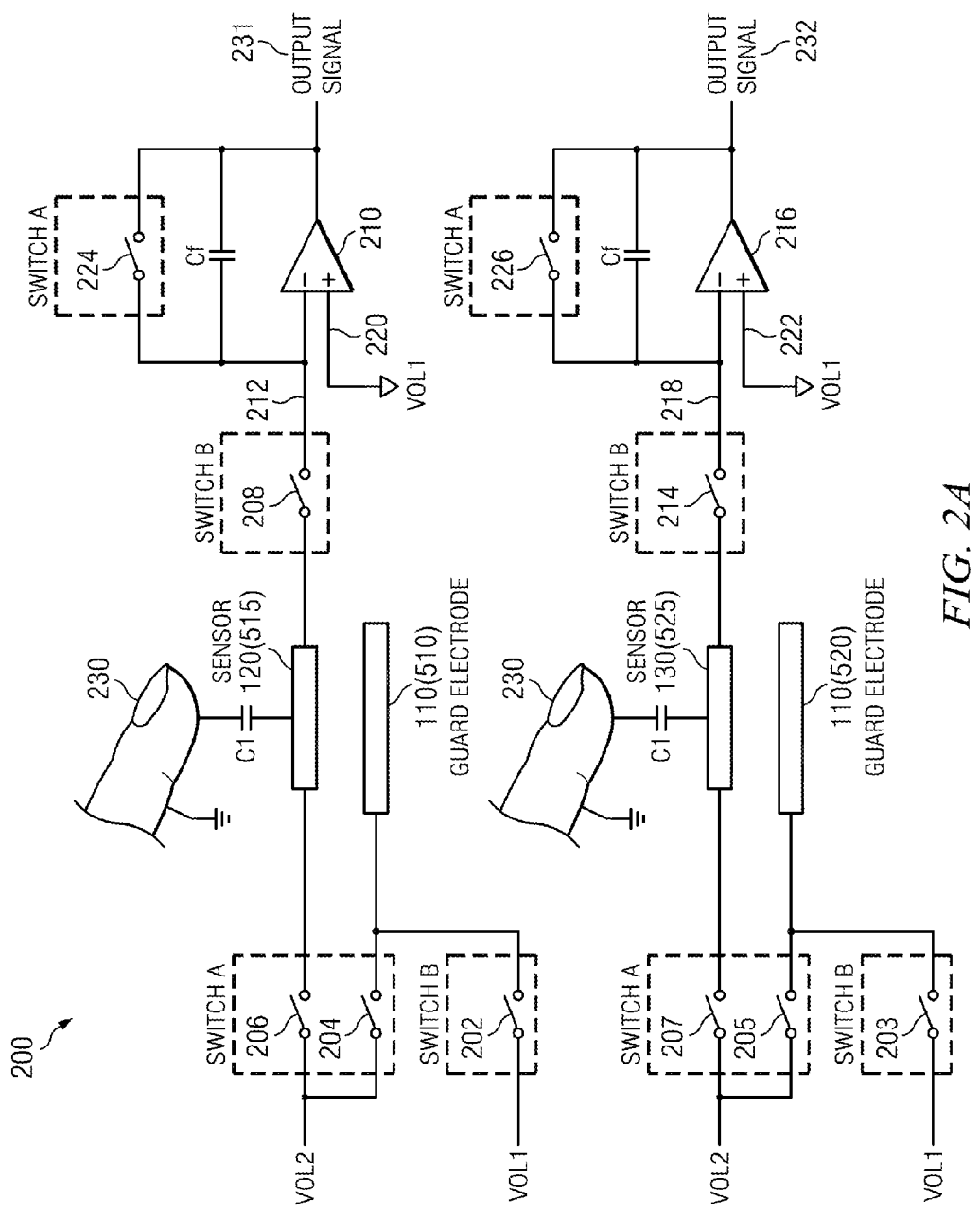
FIGS. 2A and 2B illustrate an example circuit and corresponding timing diagram, respectively, for an example embodiment of the disclosed capacitive proximity sensor circuitry.
Figure 2B:
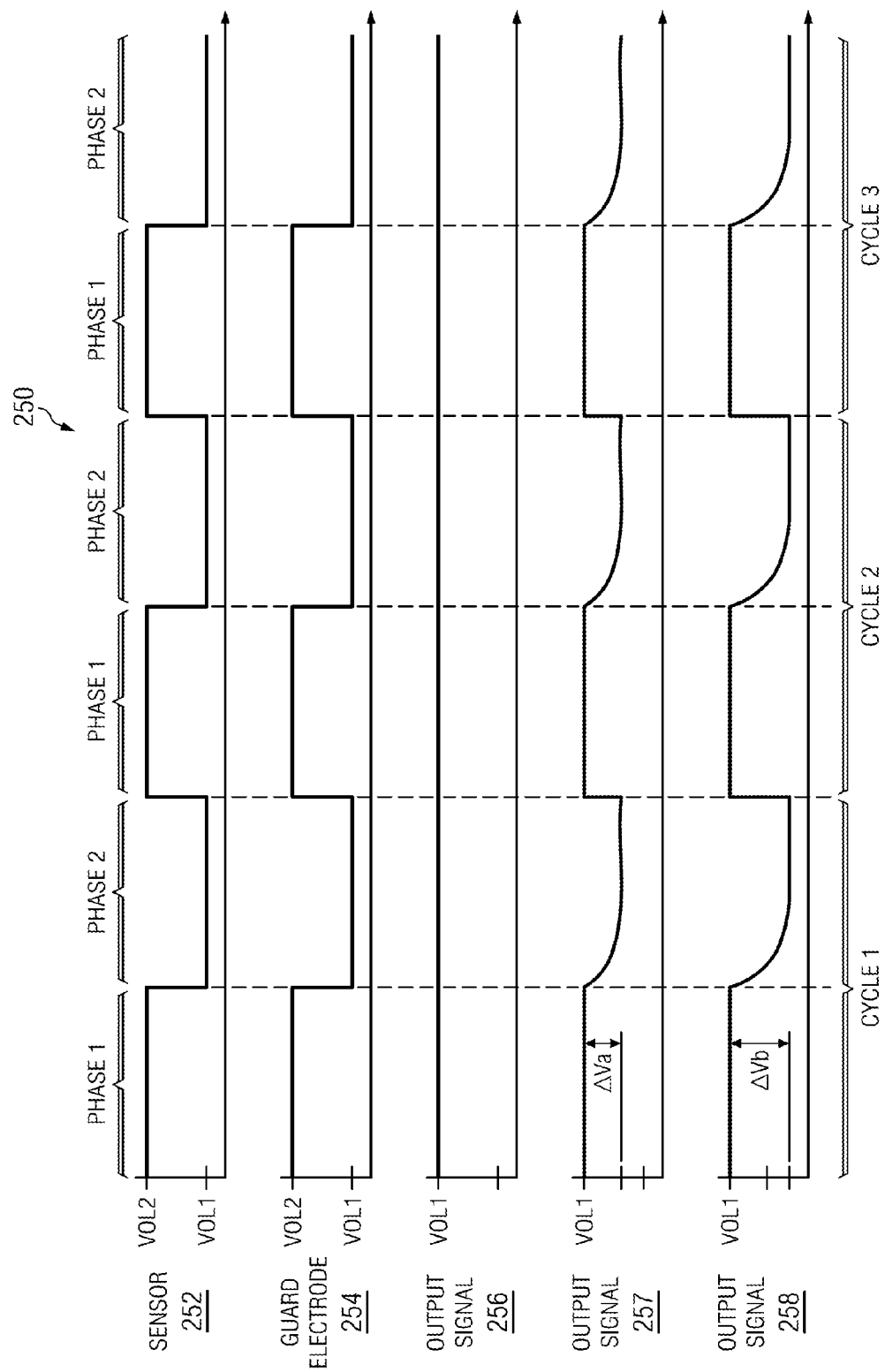
Figure 5A:
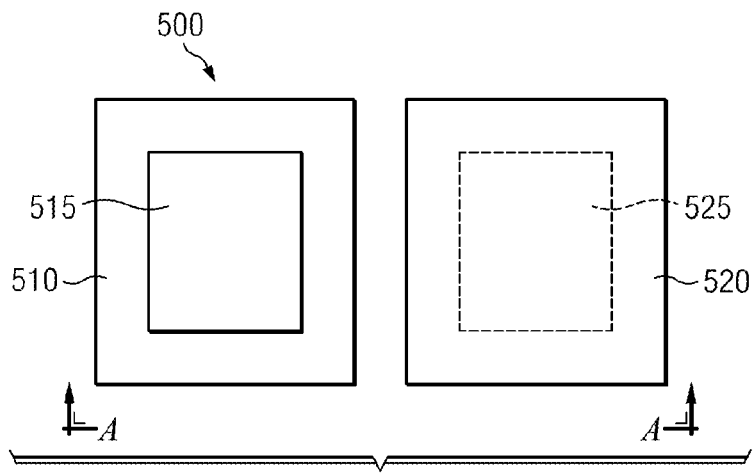
FIGS. 5A and 5B illustrate an additional example embodiment of capacitive proximity sensor circuitry.
Figure 5B:
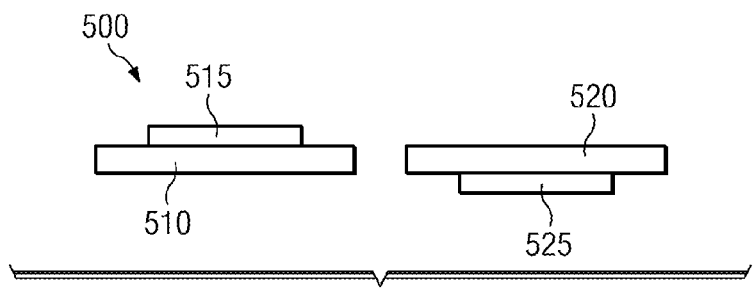

FIGS. 2A and 2B illustrate an example circuit diagram 200 and corresponding timing diagram 250, respectively, for an example embodiment of the disclosed capacitive proximity sensor circuitry 100. In the embodiment illustrated in FIG. 2A, the guard electrodes are labeled as elements 110, 510 and 520. Accordingly, the guard electrodes are labeled as element 110 to indicate a first embodiment wherein the guard electrodes comprises a single structure (although shown as two separate structures), as shown in FIGS. 1A and 1B, whereas the guard electrodes are labeled as elements 510 and 520 indicate a second embodiment, discussed with respect to FIGS. 5A and 5B, wherein the guard electrodes comprise two separate structures, as shown in FIGS. 5A and 5B. Similarly, the sensors in FIG. 2A are labeled as elements 120/515 and 130/525, wherein element 120/515 indicates that the sensor may be the first sensor 120 shown in FIGS. 1A and 1B or may be the first sensor 515 shown in FIGS. 5A and 5B, and element 130/525 indicates that the sensor may be the second sensor 130 shown in FIGS. 1A and 1B or may be the second sensor 525 shown in FIGS. 5A and 5B. As such, the circuit 200 and timing diagram 250 illustrated in FIGS. 2A and 2B may be applied to the embodiment illustrated in FIGS. 1A and 1B, as well as the embodiment illustrated in FIGS. 5A and 5B. However, for the sake of simplicity, the circuit 200 and timing diagram 250 are described below with respect to the embodiment illustrated in FIGS. 1A and 1B, although it should be appreciated that the description of the circuit 200 and timing diagram 250 may also apply to the embodiment illustrated in FIGS. 5A and 5B.

As shown in FIG. 2A, the guard electrode 110 (510) is coupled to a first voltage VOL1 via switch 202, and is coupled to a second voltage VOL2 via switch 204. Guard electrode 110 (520) is coupled to the first voltage VOL1 via switch 203, and is coupled to the second voltage VOL2 via switch 205. The first sensor 120 is coupled to the second voltage VOL2 via switch 206, and the second sensor 130 is coupled to the second voltage VOL2 via switch 207. The circuit 200 further includes switch 208 operable to couple the first sensor 120 to a first inverting amplifier 210 at a first inverting input node 212, and switch 214 operable to couple the second sensor 130 to a second inverting amplifier 216 at a second inverting input node 218. In the embodiment illustrated in FIG. 2A, the first and second sensors 120 and 130 operate independent of each other. In FIG. 2A, switches 202-205 are coupled to the guard electrode 110 (510 and 520), however, it should be appreciated that, in some embodiments, a single set of switches (e.g., switches 202 and 204) may be used.

Each of the inverting amplifiers 210 and 216 receive the first voltage VOL1 as a reference voltage at non-inverting inputs 220 and 222, respectively, and each include a feedback loop coupled between the amplifier output and the respective first and second inverting input nodes 212 and 218. As explained in greater detail below, the first inverting amplifier 210 produces a first output signal 231 indicative of a capacitance measured by the first sensor 120, and the second inverting amplifier 216 produces a second output signal 232 indicative of a capacitance measured by the second sensor 130. Each feedback loop comprises a feedback switch 224/226 coupled in parallel with a feedback capacitor Cf, wherein the value of the feedback capacitor Cf inversely affects the magnitude of a voltage swing of the respective output signal 231/232 in a negative direction. In some embodiments, the feedback capacitor Cf may vary from 1 pF to 100 pF depending upon system requirements; however, it should be understood that one skilled in the art may choose a feedback capacitor having a particular value to produce a desired output signal voltage swing magnitude for a given charge on the feedback capacitor.

As shown in FIG. 2A, the circuitry coupled to the first sensor 120 is substantially identical to the circuitry coupled to the second sensor 130. Thus, the respective first and second output signals 231 and 232 are produced in substantially the same manner. As such, the circuit 200 and timing diagram 250 are generally discussed herein with respect to a single sensor (i.e., the first sensor 120 or the second sensor 130) and the output signal (i.e., first output signal 231 or second output signal 232) produced by the inverting amplifier corresponding to the respective sensor (i.e., first inverting amplifier 210 or second inverting amplifier 216). Thus, it should be understood that the timing diagram 250 illustrated in FIG. 2B, and the operation of the embodiments as described herein, may be applied to the first sensor 120 and the corresponding circuitry producing the first output signal 231, as well as to the second sensor 130 and the corresponding circuitry producing the second output signal 232.

The circuit 200 incorporates a bootstrapping technique wherein the guard electrode 110 forms a capacitor with the adjacent sensor 120/130 in order to isolate the sensor 120/130 from surrounding conductive materials (such as other circuitry on the PCB near the sensor), thereby limiting the sensor 120/130 to detecting a capacitance from a location substantially above the sensor 120/130. As shown in FIG. 2A and further described below, the bootstrapping technique is provided by controlling the guard electrode 110 with known voltages VOL1 and VOL2 during a two-phase operation of the circuit 200. Accordingly, stray capacitance is mitigated and resulting errors in the capacitance measurements obtained by the sensor 120/130 are reduced.

To illustrate operation of the disclosed capacitive proximity sensor 100, FIGS. 2A and 2B present an example embodiment in which the circuit 200 detects proximity of a user's finger 230 using a two-phase operation, wherein a first group of switches (switches 204, 205, 206, 207, 224 and 226 generally identified in FIG. 2A as Switch A and referred to herein as Switches A) and a second group of switches (switches 202, 203, 208 and 214 generally identified in FIG. 2A as Switch B and referred to herein as Switches B) are operated in alternating fashion. As the user's finger 230 approaches the first or second sensor 120 or 130 (i.e., interferes with a fringe electric field of the sensor), the finger 230 acts as a virtual ground and forms a virtual capacitance C1 between the finger 230 and respective sensor 120/130. The virtual capacitance C1 is inversely proportional to the distance between the finger 230 and the respective sensor 120/130 and, in some embodiments, may range from 10 fF to 10 pF depending upon the size of the sensor 120/130. Thus, the closer the finger 230 is to the sensor 120/130, the greater the virtual capacitance C1. As the circuit 200 alternates between the first and second phases, the virtual capacitance C1 is transferred to the feedback capacitor Cf, as explained in greater detail below. The charge on the feedback capacitor Cf (i.e., the virtual capacitance C1 transferred at the second phase) affects the magnitude of the voltage swing occurring on the respective output signal 231/232. Thus, the magnitude of the voltage swing occurring on the output signal 231/232 may be measured to detect proximity of the finger 230.

The example timing diagram 250 in FIG. 2B illustrates the two-phase operation of the corresponding circuit 200 illustrated in FIG. 2A for a duration of three cycles. The timing diagram 250 includes a sensor waveform 252 corresponding to either the first sensor 120 or the second sensor 130, a guard electrode waveform 254 corresponding to the guard electrode 110, and three output signal waveforms 256, 257 and 258 each corresponding to either the first output signal 231 or the second output signal 232 generated for one of three conditions. The first output signal waveform 256 corresponds to an output signal 231/232 generated when the finger 230 is not present, the second output signal waveform 257 corresponds to an output signal 231/232 generated when the finger 230 is slightly detected, and the third output signal waveform 258 corresponds to an output signal 231/232 generated when the finger 230 is strongly detected.

During the first phase, Switches B are opened and Switches A are closed. When Switches B are opened, the sensor 120/130 is disconnected from the respective amplifier 210/216 and feedback capacitor Cf, and the guard electrode 110 is disconnected from VOL1. When Switches A are closed, VOL2 is applied to the sensor 120/130 and to the guard electrode 110. VOL2 biases the sensor 120/130 to charge the virtual capacitor C1 when the finger 230 is within the fringe electric field of the sensor 120/130. Additionally, the feedback capacitor Cf is shunted by the respective feedback switch 224/226 causing the feedback capacitor Cf to discharge (i.e., reset) as the amplifier 210/216 is reset. Thus, if a finger 230 was detected during the previous cycle, the output signal 231/232 returns to VOL1 (the voltage at the non-inverting input 220/222 of the amplifier 210/216), as shown during phase one of the second and third cycles of output signal waveforms 257 and 258 in FIG. 2B. Otherwise, the output signal 231/232 remains unchanged as shown by output signal waveform 256.

During the second phase, Switches A are opened and Switches B are closed. When Switches A are opened, the sensor 120/130 and guard electrode 110 are disconnected from VOL2, and the shunt provided by switch 224/226 is removed. When Switches B are closed, the charge from the virtual capacitor C1 (if any) is transferred to the feedback capacitor Cf, and VOL1 is applied to the guard electrode 110. As the charge dissipates from the virtual capacitor C1, the charge at the sensor 120/130 approaches VOL1, as shown by the sensor waveform 252 in FIG. 2B. The respective first and second inverting amplifiers 210 and 216 receive the charges on the respective feedback capacitors Cf, and operate as integrators to generate the respective first and second output signals 231 and 232.

As mentioned above, the charge on the feedback capacitor Cf affects the magnitude of the voltage swing on the respective output signal 231/232. If no finger 230 is detected, there is no charge transferred from the virtual capacitor C1 to the feedback capacitor Cf, and there is no change to the output signal 231/232, as shown by the output signal waveform 256. If the finger 230 is slightly detected, a smaller charge is transferred from the virtual capacitor C1 to the feedback capacitor Cf, and a lesser voltage swing ΔVa is produced on the output signal 231/232, as shown by the output signal waveform 257. If the finger 230 is strongly detected, a larger charge is transferred from the virtual capacitor C1 to the feedback capacitor Cf, and a greater voltage swing ΔVb is produced on the output signal 231/232, as shown by the output signal waveform 258. For example, in one embodiment, VOLT =1.65V, VOL2 =3.3V, AVa =10mV and AVb =50mV.

Figure 3:
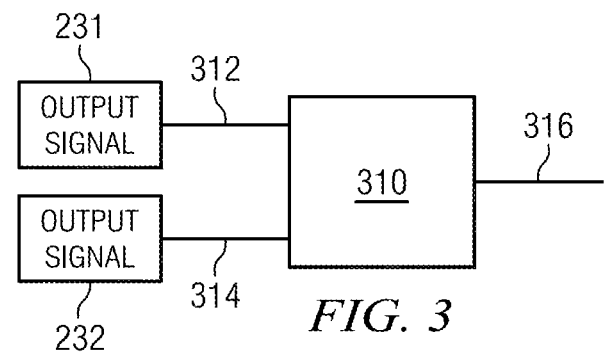
FIG. 3 illustrates an example embodiment of processing circuitry implemented to evaluate the first and second output signals produced by the circuit illustrated in FIG. 2A.

In accordance with the foregoing, the respective first and second output signals 231 and 232 may be sampled during the second phase to determine proximity detection of the finger 230 by the respective first and second sensors 120 and 130. In some embodiments, processing circuitry may be implemented to evaluate the respective first and second output signals 231 and 232. An example of such an embodiment is illustrated in FIG. 3, wherein processing circuitry 310 such as, for example, an analog-to-digital converter, receives, at a first input 312, the first output signal 231 from the first amplifier 210 and receives, at a second input 314, the second output signal 232 from the second amplifier 216, and produces an output signal 316. In the embodiment illustrated in FIG. 3, the processing circuitry 310 may evaluate the magnitude of the respective first and second output signals 231 and 232 to determine proximity detection of the finger 230 by one, both, or neither of the respective first and second sensors 120 and 130. In other embodiments, the processing circuitry 310 may evaluate whether a stronger proximity was detected by a particular one of the sensors. For example, in accordance with this embodiment, the output signal 316 may indicate whether or not the first sensor 120 detected a greater proximity than the second sensor 130. In some embodiments, the processing circuitry output signal 316 may be utilized by additional circuitry (not shown) to perform various operations in response to the detected user proximity. Examples of such operations are described below with respect to FIGS. 4A, 4B and 4C.

Figure 4A:
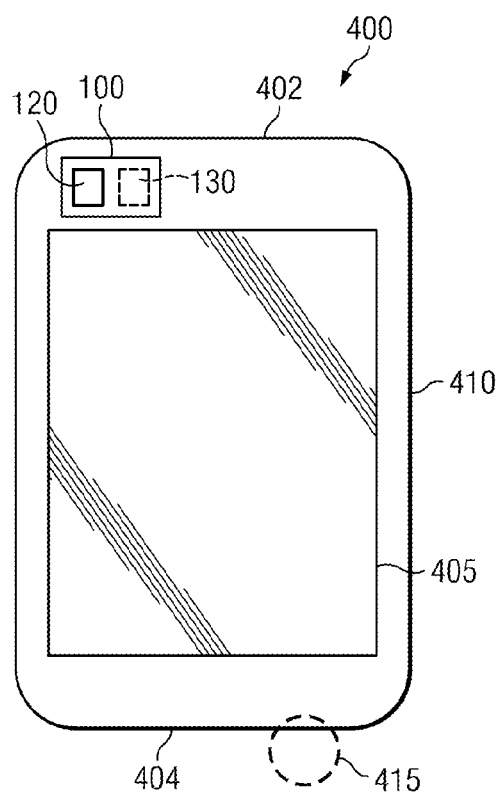
FIGS. 4A, 4B and 4C illustrate various examples of operation of an embodiment in which the disclosed capacitive proximity sensor is incorporated in a mobile phone device.
Figure 4B:
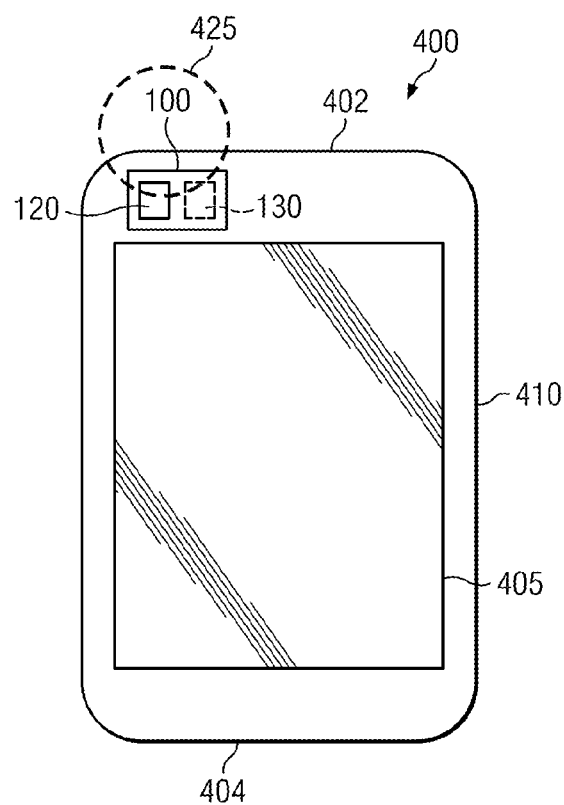
Figure 4C:
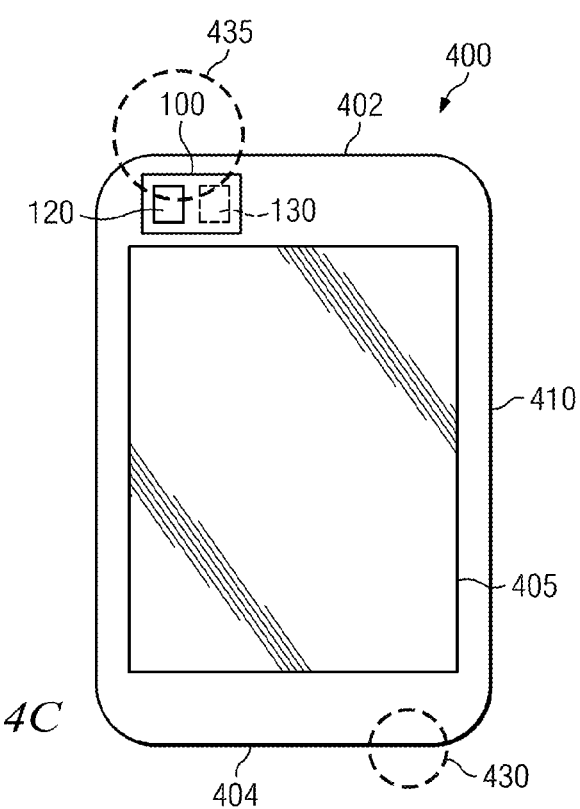

FIGS. 4A, 4B and 4C illustrate various examples of operation of an embodiment in which the disclosed capacitive proximity sensor 100 is incorporated in a mobile phone device 400 having a touch screen 405 disposed on the front surface of the phone 400, and an external casing 410 disposed along the back and side surfaces of the phone 400. As shown in FIGS. 4A, 4B and 4C, the capacitive proximity sensor 100 is located near the top 402 of the phone 400 and is positioned along a plane substantially parallel to the touch screen 405 such that the first sensor 120 is disposed towards (i.e., facing) the front surface of the phone 400, and the second sensor 130 is disposed towards the back surface of the phone 400. Readings are taken from each of the first sensor 120 and the second sensor 130 to detect proximity of an object relative to the respective first and second sensors 120 and 130. The positioning of the first sensor 120 towards the front surface of the phone 400 enhances the first sensor's 120 capability to detect user proximity generally along the front surface of the phone 400. The positioning of the second sensor 130 towards the back surface of the phone 400 enhances the second sensor's 130 capability to detect user proximity generally along the external casing 410 located along the back and side surfaces of the phone 400. In some embodiments, as described with respect to each of the examples, the readings from the first and second sensors 120 and 130 may be interpreted by additional logic/circuitry (such as that shown in FIG. 3), and an operation may be performed or an instruction for performing an operation may be provided by the additional circuitry in response to the readings from the proximity sensor circuitry 100.

FIG. 4A illustrates a first example of operation wherein a user touches or approaches (shown in FIG. 4A by dashed circle 415) the casing 410 at a location near the bottom 404 of the phone 400. Since the touch 415 is located on the casing 410 and at a substantial distance from the first sensor 120, the first sensor 120 records a low reading. The distance of the touch 415 from the second sensor 130 also causes the second sensor 130 to record a low reading. However, because the touch 415 is located on the casing 410 of the device, the reading of the second sensor 130 may be greater than the low reading of the first sensor 120. In accordance with the example illustrated in FIG. 4A, the additional circuitry of FIG. 3 may be provided in some embodiments to interpret the readings of the respective first and second sensors 120 and 130 to determine that the detected user proximity is not located above the capacitive proximity sensor 100. Accordingly, in some embodiments, the additional circuitry may determine that the phone 400 is not raised to the user's head, and thus, no related actions, such as disabling the display, may be performed.

FIG. 4B illustrates a second example of operation wherein a user touches or approaches (shown in FIG. 4B by dashed circle 425) the front surface of the phone 400 at a location above the capacitive proximity sensor 100. As shown in FIG. 4B, the touch 425 is located on the front surface of the phone 400 and, therefore, is closer to the first sensor 120 than the second sensor 130. Additionally, the guard electrode 110 shields the second sensor 130 from sensing the touch 425. Accordingly, the reading from the first sensor 120 is greater than the reading from the second sensor 130. In accordance with the example illustrated in FIG. 4B, the additional circuitry of FIG. 3 may be provided in some embodiments to interpret the readings of the respective first and second sensors 120 and 130 to determine that the detected user proximity is located above the capacitive proximity sensor 100. Accordingly, in some embodiments, the additional circuitry may determine that the phone 400 is raised to the user's head, and thus, one or more related actions, such as disabling the display, may be performed.

FIG. 4C illustrates a third example of operation wherein a user touches or approaches the phone 400 at a first location 430 along the casing 410 near the bottom 404 of the phone 400 (similar to the user touch/approach 415 discussed above with respect to FIG. 4A), and at a second location 435 above the capacitive proximity sensor 100 (similar to the user touch/approach 425 discussed above with respect to FIG. 4B). In the embodiment illustrated in FIG. 4C, the first and second sensors 120 and 130 both register readings from the user touches 430 and 435, wherein the readings registered by the respective first and second sensors 120 and 130 are the sum of the capacitance measured by each respective sensor in response to each of the user touches 430 and 435. Thus, the first sensor 120 registers a reading comprised of the low capacitance measured by the first touch 430 (as discussed above with respect to FIG. 4A) and the high capacitance measured by the second touch 435 (as discussed above with respect to FIG. 4B). Similarly, the second sensor 130 registers a reading comprised of the capacitance measured by the first touch 430 (as discussed above with respect to FIG. 4A) and the capacitance measured by the second touch 435 (as discussed above with respect to FIG. 4B). Accordingly, the reading from the first sensor 120 is greater than the reading from the second sensor 130. In accordance with the example illustrated in FIG. 4C, the additional circuitry of FIG. 3 may be provided in some embodiments to interpret the readings of the respective first and second sensors 120 and 130 to determine that a detected user proximity is located above the capacitive proximity sensor 100. Accordingly, in some embodiments, the additional circuitry may determine that the phone 400 is raised to the user's head, and thus, one or more related actions may be performed.

It should be appreciated that, in some embodiments, the additional logic/circuitry may incorporate one or more sensor-reading threshold values for determining a given range of distance of the detected user proximity from the respective sensor. For example, a first threshold value may be used to determine whether the detected user proximity is close enough to a respective sensor to warrant a first action, and a second threshold value may be used to determine whether the detected user proximity if far enough from the respective sensor to warrant a second action. For example, in one embodiment, the first threshold value may be set such that when the reading from the first sensor 120 indicates a stronger proximity detection than the reading from the second sensor 130, and also exceeds the first threshold value, the additional circuitry determines that the detected user proximity is located directly above the first sensor 120 and, therefore, may disable the display screen. Additionally, when the reading from the first sensor 120 indicates a stronger proximity detection than the reading from the second sensor 130, but does not exceed the first threshold value, the additional circuitry determines that the detected user proximity is located on the touch screen of the phone and, therefore, may not disable the display screen, but rather, may increase the brightness of the display screen. In another example, the second threshold value may be set such that when readings from either the first sensor 120 or second sensor 130 indicate a proximity detection that does not exceed the second threshold value, the additional circuitry determines that the detected user proximity may be ignored.

As mentioned above, an additional embodiment of the disclosed capacitive proximity sensor circuitry is illustrated in FIGS. 5A and 5B, wherein the sensor 500 is shown in FIG. 5A from a front view and in FIG. 5B from a side view along line A-A of FIG. 5A. The embodiment illustrated in FIGS. 5A and 5B is similar to the embodiment illustrated in FIGS. 1A and 1B and described above except that the sensor 500 is comprised of two guard electrodes, each having a single sensor disposed thereon. Thus, the capacitive proximity sensor circuit 500 includes a first guard electrode 510 having a first sensor 515, and a second guard electrode 520 having a second sensor 525. The capacitive proximity sensor circuit 500 operates similar to the sensor circuit 100 described above with respect to FIGS. 1A, 1B, 2A, 2B, 3, 4A, 4B and 4C, except that the first and second sensors 515 and 525 may be placed at different locations within a device, as explained below with respect to FIG. 6.

Figure 6:
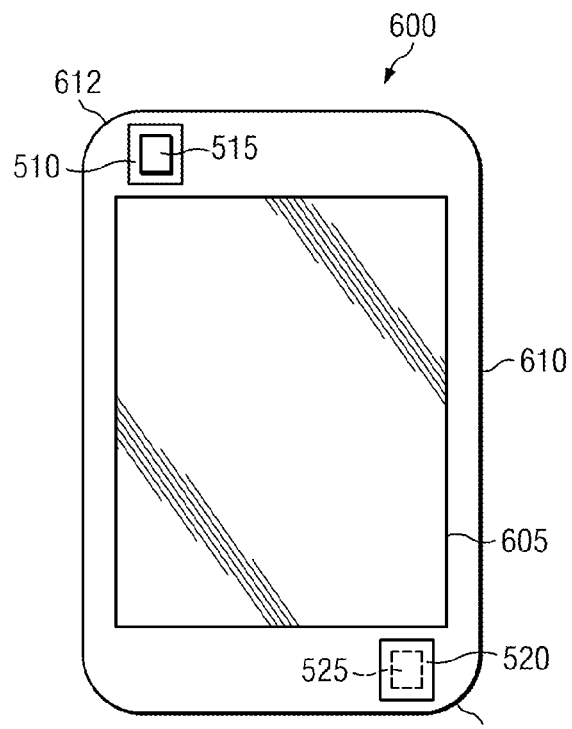
FIG. 6 illustrates an example of an embodiment in which the capacitive proximity sensor circuitry of FIGS. 5A and 5B is incorporated in a mobile phone device.

FIG. 6 illustrates an example of an embodiment in which the capacitive proximity sensor 500 is incorporated in a mobile phone device 600 having a touch screen 605 disposed on the front surface of the phone 600, and an external casing 610 disposed along the back and side surfaces of the phone 600. As shown in FIG. 6, the first and second sensors 515 and 525 (and respective guard electrodes 510 and 520) may each be placed at different locations on the phone 600. For example, in FIG. 6, the first guard electrode 510 and first sensor 515 are located towards the top left corner 612 of the phone 600, and are positioned along a plane substantially parallel to the touch screen 605 such that the first sensor 515 is disposed towards the front surface of the phone 600. Additionally, the second guard electrode 520 and second sensor 525 are located towards the bottom right corner 614 of the phone 600, and are positioned such that the second sensor 525 is disposed towards the back surface of the phone 600.

As discussed above, readings are taken from each of the first sensor 515 and the second sensor 525 to detect proximity of an object relative to the respective first and second sensors 515 and 525. The positioning of the first sensor 515 towards the front surface of the phone 600 enhances the first sensor's 515 capability to detect user proximity generally along the front surface of the phone 600. The positioning of the second sensor 525 towards the back surface of the phone 600 enhances the second sensor's 525 capability to detect user proximity generally along the external casing 610 located along the back and side surfaces of the phone 600. In some embodiments, the readings from the first and second sensors 515 and 525 may be interpreted by additional logic/circuitry (such as that illustrated in FIG. 3), and an operation may be performed or an instruction for performing an operation may be provided by the additional circuitry in response to the readings from the proximity sensor circuitry 500.

It should be appreciated that the various embodiments provided herein are intended to provide one or more examples for illustrating and/or describing the disclosed capacitive proximity sensor circuitry. As such, the disclosed capacitive proximity sensor circuitry is not limited to the devices, positions, locations, or orientations provided in the example embodiments. Additionally, the additional circuitry discussed herein is not limited to the operations, features, or functions disclosed herein, and may provide advantages other than those discussed herein.

What is claimed is:

1. A capacitive proximity sensing circuit, comprising:
   one or more guard electrodes;
   first capacitive sensor circuitry configured to sense a first capacitance and produce a first capacitive sensor reading responsive to the sensed first capacitance and indicative of detection of a user proximate to the first capacitive sensor, wherein the first capacitive sensor circuitry includes a first capacitive sensor coupled to a first side of at least one of the one or more guard electrodes;
   second capacitive sensor circuitry configured to sense a second capacitance and produce a second capacitive sensor reading responsive to the sensed second capacitance and indicative of detection of the user proximate to the second capacitive sensor, wherein the second capacitive sensor circuitry includes a second capacitive sensor coupled to a second side of at least one of the one or more guard electrodes; and
   output circuitry configured to receive and compare the first and second capacitive sensor readings and produce an output signal to indicate detection of the user proximate to the first capacitive sensor when the first capacitive sensor reading is greater than the second capacitive sensor reading.

2. The capacitive proximity sensing circuit as set forth in claim 1, wherein the first capacitive sensor circuitry further comprises a first switched integrator circuit configured to apply a voltage to the first capacitive sensor during a first phase, and configured to transfer the first capacitance to a first capacitor during a second phase and generate the first capacitive sensor reading.

3. The capacitive proximity sensing circuit as set forth in claim 1, wherein the second capacitive sensor circuitry further comprises a second switched integrator circuit configured to apply a voltage to the second capacitive sensor during a first phase, and configured to transfer the second capacitance to a second capacitor during a second phase and generate the second capacitive sensor reading.

4. The capacitive proximity sensing circuit as set forth in claim 1, wherein the one or more guard electrodes are controlled with a low impedance output to one or more voltages.

5. The capacitive proximity sensing circuit as set forth in claim 4, wherein the one or more guard electrodes are coupled to a first voltage in a first phase, and are coupled to a second voltage in a second phase.

6. The capacitive proximity sensing circuit as set forth in claim 1, wherein the one or more guard electrodes comprises a first guard electrode having the first capacitive sensor coupled to a first side of the first guard electrode, and the second capacitive sensor coupled to a second side of the first guard electrode.

7. The capacitive proximity sensing circuit as set forth in claim 1, wherein the one or more guard electrodes comprises a first guard electrode having the first capacitive sensor coupled to a first side of the first guard electrode, and a second guard electrode having the second capacitive sensor coupled to a second side of the second guard electrode.

8. The capacitive proximity sensing circuit as set forth in claim 7, wherein the first guard electrode is disposed in a device at a first location, and the second guard electrode is disposed in the device at a second location.

9. The capacitive proximity sensing circuit as set forth in claim 1, wherein the first side of the at least one of the one or more guard electrodes is disposed towards a first component of a device and the second side of the at least one of the one or more guard electrodes is disposed towards a second component of the device.

10. The capacitive proximity sensing circuit as set forth in claim 9, wherein the device comprises a mobile phone, the first component comprises a screen, and the second component comprises an external casing.

11. A capacitive proximity sensing circuit for use with a mobile device, comprising:
    one or more guard electrodes;
    a first sensor coupled to a first side of at least one of the one or more guard electrodes;
    a second sensor coupled to a second side of at least one of the one or more guard electrodes;
    first capacitive sensor circuitry coupled to the first sensor, the first capacitive sensor circuitry configured to sense user proximity to the mobile device with respect to the first sensor and to produce a first capacitive sensor reading responsive to the sensed user proximity with respect to the first sensor and indicative of the user proximate to the first sensor;
    second capacitive sensor circuitry coupled to the second sensor, the second capacitive sensor circuitry configured to sense user proximity to the mobile device with respect to the second sensor and to produce a second capacitive sensor reading responsive to the sensed user proximity with respect to the second sensor and indicative of the user proximate to the second sensor; and
    output circuitry configured to receive and compare the first and second capacitive sensor readings and produce an output signal to indicate detection of the user proximate to the first capacitive sensor when the first capacitive sensor reading is greater than the second capacitive sensor reading.

12. The capacitive proximity sensing circuit as set forth in claim 11, wherein sensing user proximity with respect to the first sensor includes the first capacitive sensor circuitry sensing a first capacitance between the user and the first sensor.

13. The capacitive proximity sensing circuit as set forth in claim 12, wherein the first capacitive sensor circuitry comprises a first switched integrator circuit configured to apply a voltage to the first sensor during a first phase, and configured to transfer the first capacitance to a first capacitor during a second phase and generate the first capacitive sensor reading.

14. The capacitive proximity sensing circuit as set forth in claim 11, wherein sensing user proximity with respect to the second sensor includes the second capacitive sensor circuitry sensing a second capacitance between the user and the second sensor.

15. The capacitive proximity sensing circuit as set forth in claim 14, wherein the second capacitive sensor circuitry comprises a second switched integrator circuit configured to apply a voltage to the second sensor during a first phase, and configured to transfer the second capacitance to a second capacitor during a second phase and generate the second capacitive sensor reading.

16. The capacitive proximity sensing circuit as set forth in claim 11, wherein the one or more guard electrodes are controlled with a low impedance output to one or more voltages.

17. The capacitive proximity sensing circuit as set forth in claim 16, wherein the one or more guard electrodes are coupled to a first voltage in a first phase, and are coupled to a second voltage in a second phase.

18. The capacitive proximity sensing circuit as set forth in claim 11, wherein the one or more guard electrodes comprises a first guard electrode having the first sensor coupled to a first side of the first guard electrode, and the second sensor coupled to a second side of the first guard electrode.

19. The capacitive proximity sensing circuit as set forth in claim 11, wherein the one or more guard electrodes comprises a first guard electrode having the first sensor coupled to a first side of the first guard electrode, and a second guard electrode having the second sensor coupled to a second side of the second guard electrode.

20. The capacitive proximity sensing circuit as set forth in claim 19, wherein the first guard electrode is disposed in a device at a first location, and the second guard electrode is disposed in the device at a second location.

21. The capacitive proximity sensing circuit as set forth in claim 11, wherein the first side of the at least one of the one or more guard electrodes is disposed towards a first component of a device.

22. The capacitive proximity sensing circuit as set forth in claim 21, wherein the first component comprises a screen.

23. The capacitive proximity sensing circuit as set forth in claim 11, wherein the second side of the at least one of the one or more guard electrodes is disposed towards a second component of a device.

24. The capacitive proximity sensing circuit as set forth in claim 23, wherein the second component of the device comprises an external casing.

* * * * *